United States Patent
Baum et al.

[11] Patent Number: 5,812,615
[45] Date of Patent: Sep. 22, 1998

[54] APPARATUS AND METHOD FOR MAXIMIZING FREQUENCY OFFSET TRACKING PERFORMANCE IN A DIGITAL RECEIVER

[54]

[75] Inventors: Kevin L. Baum, Rolling Meadows; David Paul Gurney; Stephen Leigh Kuffner, both of Algonouin, all of Ill.

[73] Assignee: Motorola, Inc., Schaumburg, Ill.

[21] Appl. No.: 897,338

[22] Filed: Jul. 21, 1997

Related U.S. Application Data

[62] Division of Ser. No. 767,173, Dec. 16, 1996.
[51] Int. Cl.[6] .................................................. H04L 27/07
[52] U.S. Cl. ...................... 375/344; 375/327; 455/192.2
[58] Field of Search .................................. 375/344, 325, 375/326, 327, 330; 455/192.1, 192.2, 205

[56] References Cited

U.S. PATENT DOCUMENTS

| 3,911,219 | 10/1975 | Mullins | 375/330 |
| 4,715,001 | 12/1987 | Deem et al. | 364/484 |
| 5,247,382 | 9/1993 | Suzuki | 359/156 |
| 5,594,757 | 1/1997 | Rohani | 375/344 |

*Primary Examiner*—Wellington Chin
*Assistant Examiner*—Conguan Tran
*Attorney, Agent, or Firm*—Darleen J. Stockley

[57] ABSTRACT

An automatic frequency control loop structure utilizes a dual selection automatic frequency control unit which is coupled to a differential phase unit and a coherent phase unit to provide a frequency corrected received signal output for efficient tracking of frequency offset drift and a much lower probability of loss of automatic frequency control loop lock. Thus, a signal from a coherent carrier recovery process provides additional benefit by utilization in adjusting frequency offset tracking performance.

3 Claims, 3 Drawing Sheets

APPARATUS AND METHOD FOR MAXIMIZING FREQUENCY OFFSET TRACKING PERFORMANCE IN A DIGITAL RECEIVER

This is a division of copending application Ser. No. 08/767,173, filed on Dec. 16, 1996.

FIELD OF THE INVENTION

This invention relates generally to frequency correction in receivers and, more particularly, to frequency offset tracking performance in digital receivers.

BACKGROUND

Digital communication systems typically include transmitters and receivers for sending and receiving messages. The transmitters generally modulate or encode the message and transmit the messages in an analog form for passage through a channel. At the receiver, the analog signal is sampled and quantized to convert the message to digital data. An automatic frequency control loop, AFC, typically including a feedback loop containing a voltage-controlled oscillator, is generally used to estimate and correct the frequency offset of the signal.

Typically, a radio designer must make compromises in designing the AFC loop. The designer can use a narrow loop bandwidth in the AFC to achieve the best steady state performance. A narrow loop bandwidth filters out more noise than a wider loop bandwidth, but a narrow loop bandwidth often results in unacceptable acquisition performance of large frequency offsets. Therefore, there is a need for an apparatus and method that provides an adaptable frequency correction for maximizing frequency offset tracking performance for a received signal in a digital radio receiver.

DETAILED DESCRIPTION OF A PREFERRED EMBODIMENT

Figure 1:
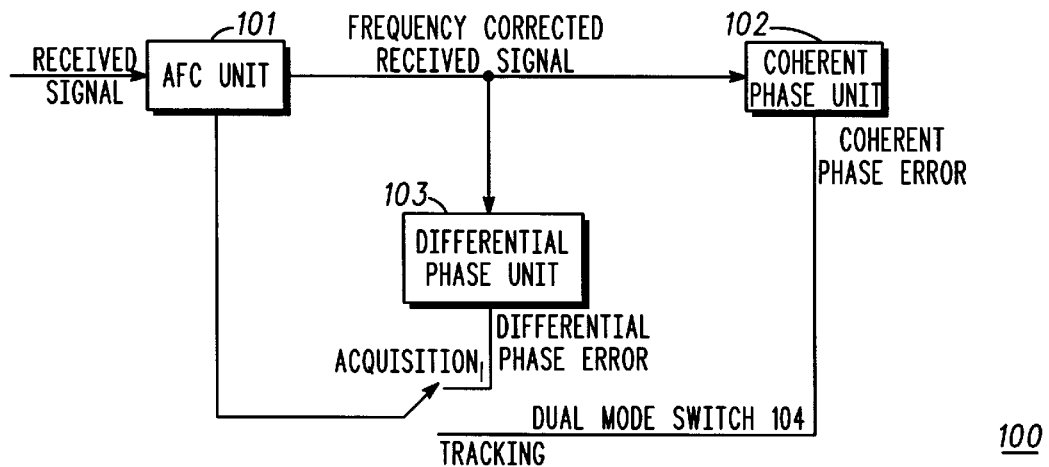
FIG. 1 is a block diagram of an adaptable frequency correction device in accordance with the present invention.

Generally, the present invention provides an apparatus and method for providing adaptable frequency correction for a received signal in a digital radio receiver wherein frequency offset tracking performance is maximized. This is accomplished by using a dual selection automatic frequency control (AFC) unit which is coupled to a differential phase unit and a coherent phase unit, and provides a corrected received signal output. The differential phase unit utilizes the corrected received signal and provides a differential phase error output which is fed back to the AFC unit and is used to update the AFC unit when the frequency offset is unknown and is potentially large. This situation commonly occurs when the receiver is first turned on, or when it first begins reception of a transmitted signal. This AFC mode is called the acquisition mode. The coherent phase unit utilizes the corrected received signal and provides a coherent phase error output which is fed back to the AFC unit and is used to update the AFC unit when the frequency offset is small or has been at least partially removed by operating the AFC unit with differential phase error feedback. This AFC mode is called the tracking mode. It should be noted that the theoretical maximum initial frequency offset which the present invention can tolerate on a quadrature phase shift keying, QPSK, modulated signal is ⅛th of the transmitted symbol rate. Noise will make the practical limit slightly lower.

A phase lock loop unit, PLL, is used throughout the description of the preferred embodiment as an exemplary embodiment of the coherent phase unit. It is clear that the coherent phase unit may be implemented using any of the coherent phase estimation methods which are known in the art.

An advantage of the present invention over prior art is that frequency offset tracking performance is maximized because of the use of the novel dual selection scheme of the present invention. Differential phase error feedback is used during the acquisition mode because the differential phase unit does not require any acquisition time in order to produce a valid differential phase error output. Moreover, in applications where the received signal is a digitally modulated information signal such as QPSK, the differential phase unit does not require knowledge of the optimal symbol sampling phase.

On the other hand, PLL coherent phase error feedback is used after AFC acquisition because the PLL unit provides a more accurate phase error signal to the AFC unit than the differential phase unit, resulting in a more accurate frequency correction. The PLL acts as a filter which reduces the variance of the phase error signal, resulting in a more accurate phase error feedback signal. However, it is advantageous to allow the AFC unit to utilize differential phase error feedback during AFC acquisition because the PLL unit has a limited "pull in" range, which means that it cannot lock onto the signal if the frequency offset of the input signal to the PLL is too large. Thus, by using differential phase error feedback during AFC acquisition and PLL coherent phase error feedback after AFC acquisition, the frequency offset tracking performance is maximized.

In one embodiment of the dual selection scheme, the AFC unit uses differential phase error feedback for a predetermined time period. The predetermined time period is generally selected to be a long enough time period to allow the AFC unit to acquire and correct a substantial portion of the frequency offset. After the predetermined time period, PLL coherent phase error feedback to the AFC unit is selected. Switching to PLL coherent phase error feedback after acquisition allows the AFC unit to correct the remaining portion of the frequency offset more accurately.

In another embodiment of the dual selection scheme, the AFC unit uses differential phase error feedback until the PLL unit is locked. Then the AFC unit switches to PLL coherent phase error feedback.

In another embodiment of the dual selection scheme, the AFC unit uses differential phase error feedback until the frequency correction value of the AFC unit remains substantially constant. Then, the AFC unit switches to receiving PLL coherent phase error feedback.

The present invention can be more fully described with reference to FIGS. 1–4. FIG. 1, numeral 100, is a block diagram of an adaptable frequency correction device in accordance with the present invention. The adaptable frequency correction device generally comprises an AFC unit 101 with a dual selection feedback switch 104, a differential phase unit 103, and a coherent phase unit 102. AFC unit 101 is operably coupled to the received signal and to a dual mode switch (104) that couples it to one of the differential phase unit 103 and the coherent phase unit 102. The received signal input to AFC unit 101 normally comprises a stream of digital phase values at a predetermined sample rate, as is known in the art. The AFC unit 101 determines a frequency correction value using at least one of a differential phase error output of differential phase unit 103 and a coherent phase error output of coherent phase unit 102, and shifts the frequency of the received signal by the determined frequency correction value to produce a frequency corrected received signal.

Figure 2:
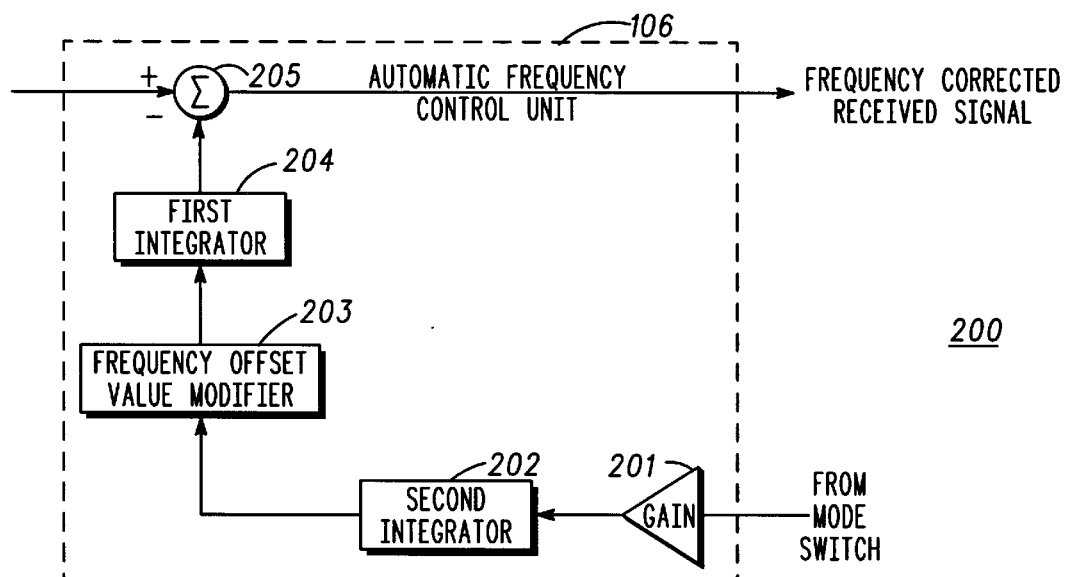
FIG. 2 is a block diagram an AFC unit 106 of FIG. 1 shown with greater particularity.

FIG. 2, numeral 200, is a block diagram an AFC unit 101 of FIG. 1 shown with greater particularity. AFC unit 101 is operative to determine a frequency correction value and shift the frequency of the received signal by the frequency correction value. AFC unit 101 generally comprises a gain element 201, an integrator 202, a frequency offset value modifier 203, an integrator 204, and a subtractor 205. Individually, elements 201 through 205 are readily known in the art, and will not be described further except to illustrate the present invention.

Gain element 201 is coupled to the dual mode switch 104 of FIG. 1, which selects either a coherent phase error or a differential phase error signal as the input to gain element 201 in accordance with the present invention as described more fully below. Gain element 201 applies a predetermined gain to the selected phase error signal. It is readily known in the art that value of gain element 201 determines the bandwidth of an AFC loop. The output of gain element 201 is coupled to integrator 202.

Integrator 202 is operably coupled to the gain element 201, integrates the scaled phase error signal, and by this calculation produces a frequency offset value at the output of the integrator 202, as is readily known in the art. The output of integrator 202 is coupled to the input of a frequency offset value modifier 203.

Frequency offset modifier 203 is operably coupled to integrator 202 and adds a predetermined value to the output of integrator 202. The predetermined value is selected to account for a known, fixed offset between the transmitted signal frequency and the normal operating frequency of the receiver. For example, if the digital receiver were designed to operate on a received signal having a 500 kHz nominal intermediate frequency, but the received signal is known to be at a 450 kHz nominal intermediate frequency, frequency offset modifier 203 will add a value representative of 50 kHz to the frequency offset value to correct for this known, fixed nominal offset. The output of frequency offset value modifier 203 is a frequency correction value which is coupled to integrator 204. If there is no fixed nominal offset in the receiver, then frequency offset modifier may be removed from AFC unit 106. In this case, the output of integrator 202 would be the frequency correction value and would be directly coupled to integrator 204.

Integrator 204 is operably coupled to frequency offset value modifier 203 and integrates the input frequency correction value to produce a phase value output that is changing at the rate specified by the input frequency correction value. The output of integrator 204 may also be referred to as a phase ramp signal. The output of integrator 204 is coupled to subtractor 205.

Subtractor 205 is operative to shift the frequency of the received signal by the calculated frequency correction value. Shifting the frequency of the received signal by the calculated frequency correction value is accomplished by subtracting the phase ramp signal that is output from integrator 204 from the received signal phase input signal. Subtractor 205 is effectively acting as a mixer in this configuration. Subtractor 205 produces at its output a frequency corrected received signal.

Figure 3:
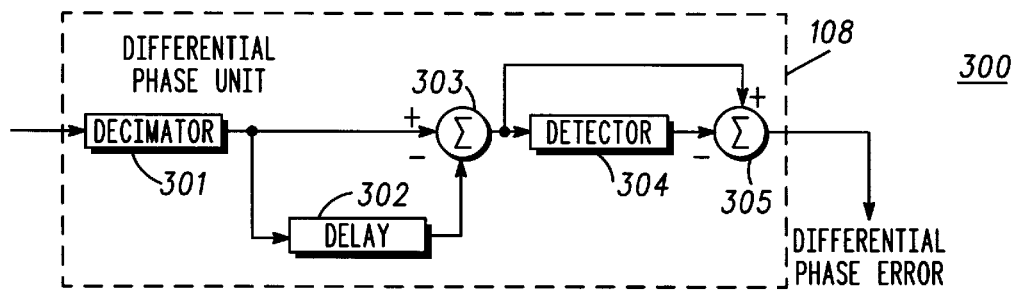
FIG. 3 is a block diagram of a differential phase unit 108 of FIG. 1 shown with greater particularity.

FIG. 3, numeral 300, is a block diagram of a differential phase unit 103 of FIG. 1 shown with greater particularity. Differential phase unit 103 is operably coupled to receive the frequency corrected received signal from the AFC unit 101 and utilizes the frequency corrected received signal to produce a differential phase error output. Differential phase unit 108 generally comprises a decimator 301, a delay element 302, a subtractor 303, a detector 304, and a subtractor 305. Individually, elements 301 through 305 are readily known in the art, and will not be described further except to illustrate the present invention.

Decimator 301 is coupled to receive the frequency corrected received signal and is operative to produce a reduced sample rate signal at its output. A typical digital receiver receives a digitally modulated signal such as a QPSK modulated signal. The received signal typically is sampled at a rate which is an integer multiple of the transmitted symbol rate. For example, the digital receiver may produce 8 samples over the duration of a QPSK symbol. This sample rate is referred to as 8 samples per symbol, or 8X. Decimator 301 reduces the sample rate of its output to a lower rate such as 2X. The reason for reducing the sample rate in differential phase unit 108 is to reduce the processing burden of the differential phase unit 108. The reduced sample rate is generally chosen to be greater than or equal to 2X so that the differential phase unit 108 can operate without knowledge of optimal symbol sampling information. By operating the differential phase unit 108 at a rate greater than or equal to 2X, at least portions of the decimated signal are assured to be near the optimal symbol sampling location, so that optimal symbol sampling information is not needed. The portions of the decimated signal that are not near the optimal symbol sampling location will decrease the accuracy of the differential phase error. If optimal symbol sampling information is available, the decimator 301 may decimate to 1X. However, the present invention typically operates the differential phase unit 108 without knowledge of the optimal symbol sampling information because optimal symbol sampling information is difficult to obtain when the received signal frequency offset is large. It should be also be understood that decimator 301 could also be embodied outside the differential phase unit.

The output of decimator 301 is coupled to subtractor 303 and, in feedforward fashion, to delay element 302 which is then coupled to subtractor 303. Delay element 302 typically delays the input signal by 1 symbol duration to produce a delayed output. For example, if the sample rate is 2X, delay element 302 will delay the input by 2 samples.

Subtractor 303 subtracts the delayed output value from the non-delayed value. By this operation, a differential phase value is produced at the output of subtractor 303. The differential phase value represents the phase difference between a phase value and a symbol period delayed phase value. The output of subtractor 303 is coupled to a second subtractor 305 and to a detector 304 which is then coupled in feedforward fashion to subtractor 305.

Detector 304 is operative to compare the differential phase value input to a predetermined set of phase values, and to output the one phase value from the predetermined set of phase values which is closest to the input phase value. For example, if the digital receiver is receiving a QPSK modulated signal, the predetermined set of phase values would consist of four elements representing the four possible QPSK one symbol delay differential phase values $\{0, \pi/2, \pi, 3\pi/2\}$. Detector 304 is sometimes also referred to as a slicer in the art.

The output of detector 304 and subtractor 303 are coupled to subtractor 305. Subtractor 305 is operative to compute a differential phase error output by subtracting the output of detector 304 from the output of subtractor 303. The differential phase error output of subtractor 305 is, on average, indicative of the amount of frequency offset in the received signal. The differential phase error output of subtractor 305 is coupled to dual mode switch 110 of FIG. 1 such that differential phase error feedback is provided to AFC unit 106 of FIG. 1 when dual mode switch selects the output of differential phase unit 108.

Figure 4:
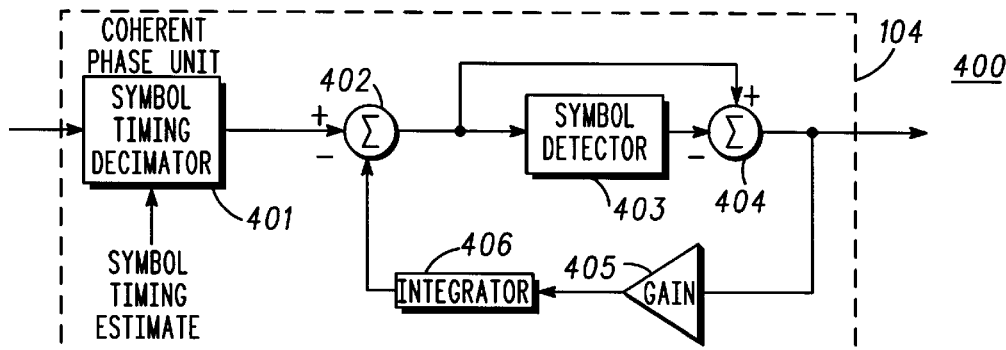
FIG. 4 is a block diagram of a coherent phase unit 104 of FIG. 1 shown with greater particularity.

FIG. 4, numeral 400, is a block diagram of a coherent phase unit 102 of FIG. 1 implemented as a PLL unit and shown with greater particularity. The PLL unit is operative to utilize the frequency corrected received signal and provide a coherent phase error output which is fed back to the AFC unit and is used to update the AFC unit 101 when the frequency offset is small or has been at least partially removed by operating the AFC unit 101 with differential phase error feedback. The PLL unit generally comprises a decimator 401, a first subtractor 402, a symbol detector 403, a second subtractor 404, a gain element 405, and an integrator 406. In this embodiment, the PLL unit is a first order PLL unit. Individually, elements 401 through 406 are readily known in the art, and will not be described further except to illustrate the present invention.

Decimator 401 is coupled to receive the frequency corrected received signal and a symbol timing estimate and is operative to produce a reduced sample rate signal at its output. A typical digital receiver receives a digitally modulated signal such as a QPSK modulated signal. The received signal typically is sampled at a rate which is an integer multiple of the transmitted symbol rate. For example, the digital receiver may produce 8 samples over the duration of a QPSK symbol. This sample rate is referred to as 8 samples per symbol, or 8X. In one embodiment, the decimator 401 reduces the sample rate to 1X by outputting only the 1X samples specified by the symbol timing input. The symbol timing input specifies which of the several samples per symbol in the digital receiver is optimum for accurately detecting the received symbol stream. The symbol timing estimate can be obtained from any of several symbol timing recovery methods which are known in the art. The reason for decimating to one sample per symbol is that the PLL unit generates coherent phase error information based on detected symbols, and it is known in the art that one sample per symbol chosen in accordance with a symbol timing estimate provides sufficient information for detecting the symbols. It should be also be understood that decimator 401 could be embodied outside the PLL unit.

The output of decimator 401 is coupled to subtractor 402. Also coupled to subtractor is the output of integrator 406. Subtractor 402 is operative to subtract an estimated carrier phase of the PLL unit from the decimated signal input to produce a phase corrected output signal. The output of subtractor 402 is coupled to symbol detector 403 and, in feedforward fashion to subtractor 404, where the output of symbol detector 403 is coupled to subtractor 404.

Symbol detector 403 is operative to compare the phase corrected signal input to a predetermined set of phase values, and to output the one phase value from the predetermined set of phase values which is closest to the input phase value. The output phase value is referred to as a detected symbol phase value. The predetermined phase values are chosen in accordance with the modulation method used to transmit information to the digital receiver. For example, if the digital receiver is receiving a QPSK modulated signal, the predetermined set of phase values would consist of four elements representing the four possible QPSK transmitted phase values $\{\pi/4, 3\pi/4, -3\pi/4, -\pi/4\}$. Detector 304 is sometimes also referred to as a symbol slicer in the art.

Subtractor 404 is operative to subtract the detected symbol phase value from the corrected phase value in order to produce a coherent phase error output. The coherent phase error output is coupled to mode switch 110 of FIG. 1 and to gain element 405.

The coherent phase error output of subtractor 404 is coupled to dual mode switch 104 of FIG. 1 such that coherent phase error feedback is provided to AFC unit 101 of FIG. 1 when dual mode switch selects the output of the coherent phase unit 102 in accordance with the present invention.

Gain element 405 is operative to scale the coherent phase error by a predetermined value to produce a scaled error at the output. The predetermined value is known as the loop gain in the art. An acceptable value for the loop gain is, for example 0.25. The output of gain element 405 is coupled to integrator 406.

Integrator 406 is operative to integrate the scaled error to produce an estimated carrier phase output. The estimated carrier phase output is coupled to subtractor 402, as was previously described.

Other implementations of the PLL unit are also within the scope of the present invention. For example, if the digital receiver is receiving a known information sequence such as a predetermined training sequence, symbol detector 403 can be replaced with a symbol source which reproduces the predetermined training sequence. In another example, if the digital receiver is receiving an unmodulated carrier signal, decimator 401 can be removed from the PLL unit.

Figure 5:
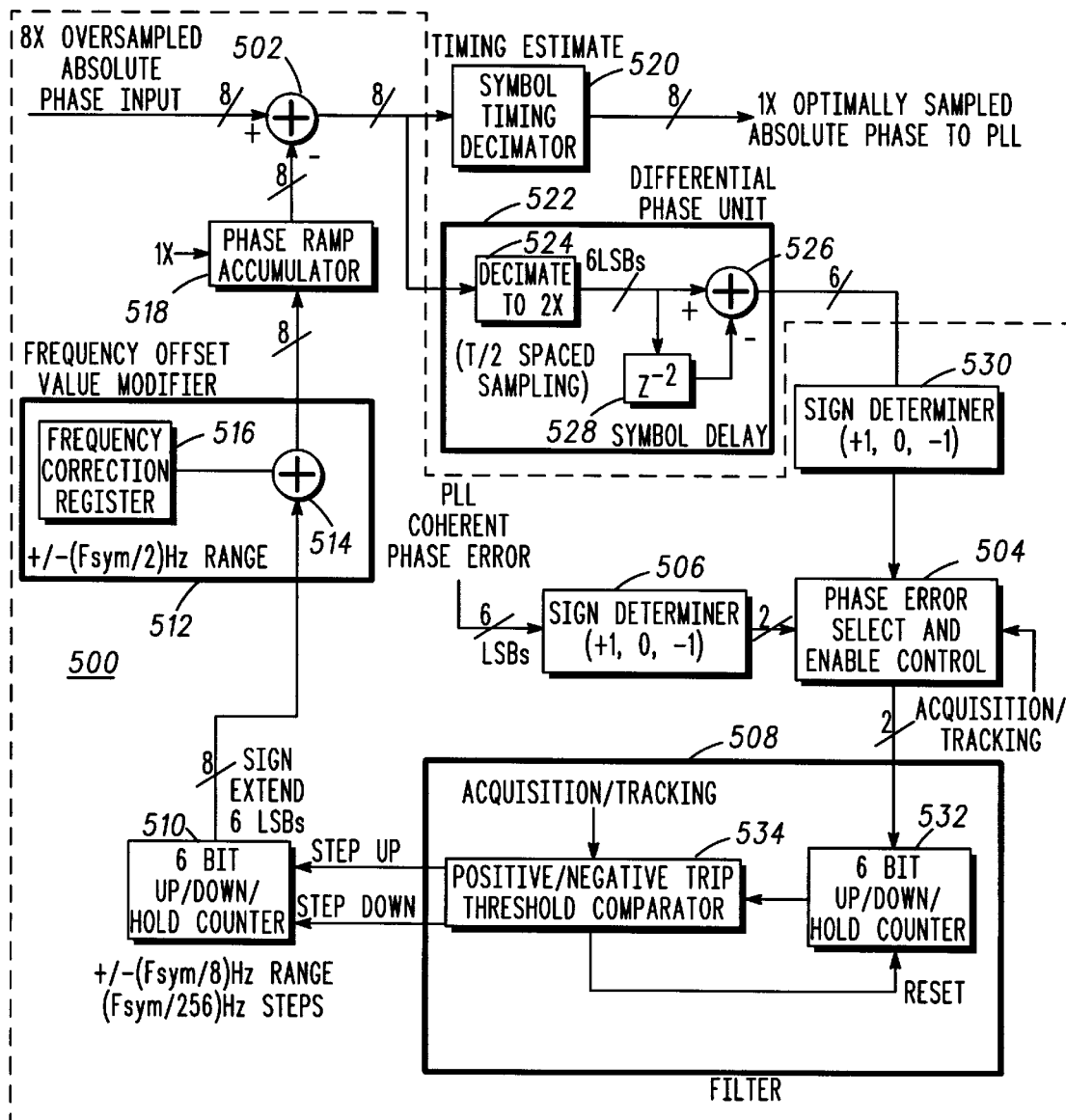
FIG. 5 is a block diagram of an economical implementation of the automatic frequency control unit and the differential phase unit in accordance with the present invention wherein the phase lock loop unit is not shown.
Figures 6, 7:
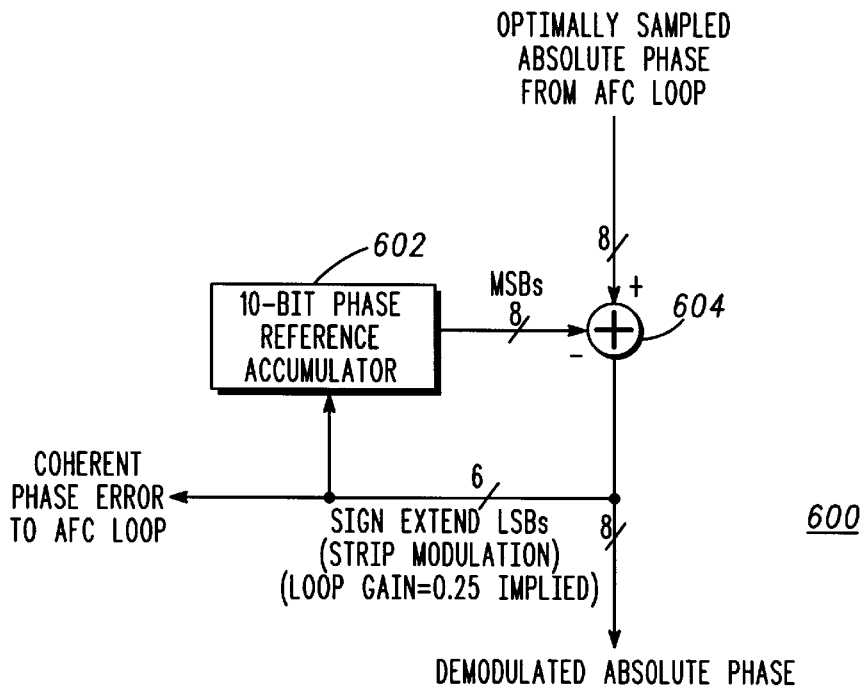
FIG. 6 is a block diagram of one implementation of a phase lock loop unit that may be utilized together with the automatic frequency control unit and the differential phase unit of FIG. 5.
FIG. 7 is a flow chart of steps in accordance with the method of the present invention wherein frequency correction is provided utilizing novel feedback for a received signal in a digital receiver such that frequency offset tracking performance is maximized.

Now that the general operation of the present invention has been described, an economical digital implementation will be presented in conjunction with FIG. 5 and FIG. 6. FIG. 5, numeral 500, is a block diagram of an economical implementation in accordance with the present invention wherein the PLL unit is not shown. The PLL unit for the implementation of FIG. 5 is shown in FIG. 6, numeral 600. The economical implementation of FIG. 5 can be used to correct the frequency of a QPSK modulated signal. Minor modifications can be made to enable the economical implementation to be used with other modulated signals such as 8 PSK.

In the economical implementation, processing requirements are substantially reduced by processing only 2 bit phase error values in the AFC unit 106. If the phase error is positive, then it is mapped to a value of +1. If the phase error is negative, it is mapped to a value of −1. If the phase error is 0, it remains at a value of 0. The non-linear mapping of the phase error values results in a non-linear AFC unit loop structure.

The economical implementation is operative to provide frequency correction utilizing dual mode feedback for a received signal in a digital receiver. It generally comprises an AFC unit 536 for determining a frequency correction value and shifting the frequency of the received signal by said frequency correction value, a differential phase unit 522, and a first order PLL unit 600 of FIG. 6. Where selected, a symbol timing decimator 520 may be implemented outside the PLL unit.

AFC unit 536 is operably coupled to first order PLL unit 600 of FIG. 6 and differential phase unit 522. AFC unit 536 generally comprises subtractor 502, first sign determiner 530, second sign determiner 506, selector 504, filter 508, frequency step counter 510, frequency offset value modifier 512, and accumulator 518.

The received signal and the output of accumulator 518 are coupled to subtractor 502. Subtractor 502 is operative to shift the frequency of the received signal by a frequency correction value output by the accumulator 518 to provide a corrected received signal. Subtractor 502 is effectively acting as a mixer in this configuration.

A sign determiner 530 is coupled to the differential phase error output of differential phase unit 522. Sign determiner 530 is operative to map the differential phase error to an output value in accordance with the sign of the differential phase error. If the differential phase error is positive, then it is mapped to a value of +1. If the differential phase error is negative, it is mapped to a value of −1. If the differential phase error is 0, it remains at a value of 0. Also, if the magnitude of the differential phase error is π/4, the sign of the coherent phase error is indeterminate for QPSK modulation, so it is mapped to a value of 0. The described mapping process removes the amplitude information from the differential phase error signal, but preserves the sign.

A second sign determiner 506 is coupled to the coherent phase error output of PLL unit 600 of FIG. 6. Sign determiner 506 is operative to map the coherent phase error to an output value in accordance with the sign of the coherent phase error. If the coherent phase error is positive, then it is mapped to a value of +1. If the coherent phase error is negative, it is mapped to a value of −1. If the coherent phase error is 0, it remains at a value of 0. Also, if the magnitude of the coherent phase error is π/4, the sign of the coherent phase error is indeterminate for QPSK modulation, so it is mapped to a value of 0. The described mapping process removes the amplitude information from the coherent phase error signal, but preserves the sign.

The output of sign determiners 530 and 506 are coupled to selector 504. Selector 504 is operative to select the output of sign determiner 530 during an acquisition mode of the AFC unit, and the output of second sign determiner 506 during a tracking mode of the AFC unit. By so doing, the AFC unit 536 operates with differential phase error feedback during the acquisition mode, and coherent phase error feedback during the tracking mode.

It is noted that selector 504 is embodied within AFC unit 536 for convenience in the economical implementation. Selector 504 is analogous to the dual mode switch 110 of FIG. 1. It is also noted that sign determiners 530 and 506 may be replaced with a single sign determiner coupled to the output of selector 504 without affecting the operation of the AFC unit 536.

The output of selector 504 is coupled to filter 508. Filter 508 is operative to accumulate the selector output values, compare the accumulated values to a predetermined threshold value, and generate an output for indicating an update of a frequency step counter. Filter 508 comprises a counter 532 and a comparator 534. Counter 532 is operative to accumulate the input values. For example, if the input value is +1, the counter output is incremented. If the input value is −1, the counter output is decremented. If the input value is 0, the counter output is not changed. If the received signal has a positive frequency offset, the output of counter 532 will tend to increase with time because the phase error input will tend to be positive. Likewise, if the received signal has a negative frequency offset, the output of counter 532 will tend to decrease with time. In the embodiment shown in FIG. 5, the counter is a 6 bit up/down/hold counter, but clearly other counter arrangements may be utilized.

Comparator 534, in the present embodiment being a positive/negative trip threshold comparator, is operative to compare the output of counter 532 with predetermined positive and negative threshold values. If the counter 532 output is greater than the positive threshold, then comparator 534 outputs a step up signal to frequency step counter 510, implemented in this embodiment as a 6 bit up/down/hold counter, and resets counter 532 to a value of zero. If the counter 532 output is less than the negative threshold, then comparator 534 outputs a step down signal to frequency step counter 510 and resets counter 532 to a value of zero. The magnitude of the positive and negative threshold values for comparator 534 are typically chosen to be equal. Larger threshold magnitude values result in slower tracking but with reduced noise and jitter. Smaller threshold magnitude values result in faster tracking but with more noise and jitter. Different thresholds are generally used for acquisition and tracking. During acquisition, thresholds are chosen to allow fast tracking so that acquisition will occur as quickly as possible. During tracking, the threshold values are chosen to achieve slower tracking and reduced noise.

The step up and step down outputs of comparator 534 are connected to frequency step counter 510. Frequency step counter 510 is operative to output a frequency offset value. The frequency offset value is incremented when a step up signal is received from comparator 534. The frequency offset value is decremented when a step down signal is received from comparator 534. The output of frequency step counter 510 is coupled to frequency offset value modifier 512.

Frequency offset value modifier 512 is operative to output a modified frequency offset value which is corrected for a predetermined frequency offset in the received signal. In the embodiment shown in FIG. 5 the frequency offset value modifier includes a summer 514 that is operably coupled to receive the output of the frequency step counter 510 and an output from a frequency correction register 512 having predetermined values stored therein. Frequency offset value modifier 512 operates as previously described in conjunction with element 203 of FIG. 2. The output of frequency offset value modifier 512 is coupled to accumulator 518.

Accumulator 518 is operative to integrate or accumulate the modified frequency offset value in order to produce a phase ramp output. The phase ramp output has a slope which is equal to the modified frequency offset value output by the frequency offset value modifier 512. Therefore, by subtracting the output of accumulator 513 from the received signal using subtractor 502, the frequency of the received signal will be shifted by an amount equal to the modified frequency offset value to produce a frequency corrected received signal.

It is noted that in the economical implementation of FIG. 5, accumulator 518 is updated only at a 1X rate. There is no need to correct the signal at a higher rate if all subsequent processing of the corrected received signal is at a 1X rate or if higher rate processing uses only functions of symbol spaced data. For example, in this embodiment, the PLL unit uses only 1X data, and although the differential phase unit 522 uses 2X data, the differential phase error is only computed as a function of symbol spaced data. If it is desired to update accumulator 518 at a higher rate, the modified frequency offset value must be converted from the typical phase change per symbol representation to a phase change per sample representation.

It is also noted that an integer number representation is generally used in the economical implementation of FIG. 5. For example, the received signal is an 8 bit number having possible values from 0 to 255. These values represent phase values from $-\pi$ to $\pi$ radians in steps of $2\pi/256$ radians.

The output of subtractor 502 is coupled to differential phase unit 522 and a symbol timing decimator 520. Symbol timing decimator 520 operates identically to the symbol timing decimator 401 of FIG. 4, except that in this implementation, for convenience, the decimator is embodied outside of the PLL unit.

Differential phase unit 522 of FIG. 5 is operably coupled to subtractor 502 and is operative to determine a differential phase error. Differential phase error unit 522 operates generally as previously described in conjunction with FIG. 3. However, in the economical implementation, detector 304 and subtractor 305 of FIG. 3 are not needed. By processing only the 6 least significant bits of the 8 bit decimated phase values, the operations performed by detector 304 and subtractor 305 are incorporated into differential phase unit 522 without any additional processing.

PLL unit 600 of FIG. 6 is a first order PLL which is coupled to optimal symbol timing decimator 520 of FIG. 5 and is operative to utilize the frequency corrected received signal to provide a coherent phase error output. PLL unit 600 includes subtractor 604 and a reference accumulator 602. In this implementation, the reference accumulator 602 is a 10-bit phase accumulator that is coupled in feedback fashion to the subtractor 604. The subtractor 604 received an optimally sampled absolute phase from the AFC loop, i.e., in the present instance being the output of the symbol timing decimator 520 of FIG. 5, and outputs a coherent phase error to the AFC loop, i.e., to the second sign determiner 506 of FIG. 5. PLL unit 600 operates generally as previously described in conjunction with FIG. 4. However, in the economical implementation, symbol detector 403 and subtractor 404 of FIG. 4 are not required. By discarding the two most significant bits of the 8 bit phase value and sign extending the resulting 6 bit number, a coherent phase error is generated which is equivalent to the coherent phase error which would be obtained using symbol detector 403 and subtractor 404 of FIG. 4. Moreover, gain element 405 of FIG. 4 is not present in PLL unit 600. By placing the 6 bit phase error into the lower portion of the input to the 10 bit accumulator 602, a two bit right shift of the phase error is achieved, resulting in an implied loop gain of 0.25. Integration of the scaled phase error is performed by accumulator 602.

The economical implementation may be quantitatively analyzed with conventional discrete time mathematics. For the classical first order loop used to track the phase in the PLL, the system transfer function that relates the phase error output (which is fed back to the AFC loop) to the input (which is the optimally sampled phase time series) and may be shown to be $$H(z)=(1-z^{-1})/(1-(1-k)z^{-1})$$

where k is the PLL loop gain as discussed previously in reference to element 405 of FIG. 4. This loop will be driven by a phase ramp plus noise since the AFC resolution will generally prohibit an exact match between the input frequency offset and the quantized frequency correction. The AFC loop will attempt to converge to the mean value of the phase error output (which represents the frequency offset), in the presence of noise, which is represented by the variance of the process. When this system is driven with a phase ramp that increments by $\theta$ per symbol, where $\theta=\omega_{OS} T_S$ ($\omega_{OS}$ being the residual radian frequency error after AFC correction, with $T_S$ being the symbol duration) the phase error output can be shown to be $$f(n)=\theta/k(1-(1-k)^n)$$

This waveform starts at zero and geometrically increases to the final value of $\theta/k$ (when the PLL is locked), where $\theta$ and k are as previously described. For k=1, which corresponds to an optimally sampled differential phase unit, the final value, which is the mean value of the process used to drive the AFC loop in track mode, is $\theta$, whereas for the PLL with k=0.25, the final value is $4\theta$. Note that the sign of the final value, and hence the sign of the mean value of the process driving the AFC unit, is the same as the sign of the residual frequency offset $\omega_{OS}$, which will drive the AFC loop in the proper direction. Note also that the mean value of the process driving the AFC loop increases inversely with k. This magnification of any frequency offset by the PLL is a strongly desired effect.

In addition to using the mean value of the process, the variance is also required so that the probability of deciding that a phase step of a wrong sign was presented to the AFC loop may be determined. When a phase error step of the wrong sign is presented to the AFC loop, it increases both the number of symbols and the time required to trip the threshold. A large enough variance may also result in tripping the wrong sign threshold, thereby sending the AFC in the wrong direction. This is generally recovered from quickly since it increases the frequency error between the input ramp and the AFC ramp, resulting in a larger mean value that will consequently result in smaller probability of sign error for a fixed variance.

The frequency response of the classical first order phase locked loop is highpass, with a −3 dB corner frequency $\omega_{hp}$ of $$\omega_{hp}T_S=\cos^{-1}(2-2k)/(2-2k+k^2)$$

For the PLL with k=0.25, with $T_S$=5 $\mu$sec, this corresponds to a highpass corner of 9 kHz. For the differential phase unit with k=1, the highpass corner is 50 kHz. The effect of the filtering on the variance of the input process (or the equivalent noise bandwidth) may be found by integrating the magnitude squared of the loop transfer function with $z=e^{j\omega T}$. The value of this integral evaluated from 0 to $\pi$ can be shown to be $$\int |H(e^{j\omega T})|^2 d\omega T=2\pi/(2-k)$$

For the optimally sampled differential phase unit, the input variance (assumed white) is multiplied by $2\pi$, whereas for the PLL with k=0.25, the input variance is multiplied by 1.143π. Thus, the variance of the PLL output process is 2.43 dB less than the variance of the differential phase unit process, another desired improvement. The probability of phase sign error may now be estimated. Since the noise in the input phase time series is assumed to be approximately gaussian distributed, with standard deviation σ, the density of the output process may be determined with knowledge of the mean value and variance effects introduced by the loop. For k=0.25, the mean is 4θ and the standard deviation is 1.143πσ, whereas for the differential phase unit, the mean is θ and the standard deviation is 2πσ. The described PLL feedback approach has a larger mean and a smaller variance, which will result in a reduced probability of AFC loop input sign error when compared with the differential phase unit approach. Using complementary error functions, the probability of sign error, $p_s$, may be described as for general k, $$p_s=Erfc[(((2-k)/2\pi)^{0.5}\theta)/k\sigma]$$

for differential, $$p_s=Erfc[0.4\theta/\sigma]$$

for PLL with k=0.25, $$p_s=Erfc[2.11\theta/\sigma]$$

The argument in the complementary error function, Erfc, for the optimally sampled PLL is a factor of 5.275 greater than for the optimally sampled differential phase unit, which results in dramatic improvement for even small values of θ/σ. Thus, the described structure of the present invention effectively increases the SNR of the AFC loop input signal by a total of 14.4 dB, resulting in greatly improved performance and higher reliability on poor channels. For the non-optimally sampled T/2 spaced differential phase unit used in acquisition mode, the probability of sign error is even worse than for the optimally sampled differential phase unit described above, since when the modulation is removed in non-optimal sampling, it may not be an integer multiple of π/2, and hence an additional source of noise is introduced when the modulation is removed. It is estimated that the coherent phase error feedback structure provides at least a 17.4 dB SNR gain when compared to the T/2 spaced differential phase unit. Thus the tracking loop with gain=0.25 provides greatly enhanced tracking performance over the differentially detected acquisition mode. The improved AFC loop structure of the present invention results in much more accurate tracking of frequency offset drift, and a much lower probability of loss of AFC lock.

The non-linear loop structure of the present invention allows narrow loop bandwidths to be implemented easily in hardware.

FIG. 7, numeral 700, is a flow chart of steps in accordance with the method of the present invention wherein frequency correction is provided utilizing novel feedback for a received signal in a digital receiver such that frequency offset tracking performance is maximized. The method includes the steps of: A) utilizing a dual-selection automatic frequency control unit for determining a frequency correction value using at least one of: a differential phase error output of the differential phase unit and a coherent phase error output of the phase lock loop unit, and shifting a frequency of the received signal by said frequency correction value in accordance with a dual-mode scheme to provide a corrected received signal (702); B) utilizing, by a phase lock loop unit, the corrected received signal to provide a coherent phase error output (704) and C) utilizing, by a differential phase unit, the corrected received signal to provide the differential phase error output (706). Where selected, a non-linear loop structure may be utilized by the automatic frequency control unit. The automatic frequency control unit may utilize at least a sign of the error signal from the phase-lock loop unit to determine the frequency offset. Typically, differential phase error feedback is provided during acquisiton and coherent phase error feedback is provided during tracking. Where selected, the automatic frequency control unit may operate only when the phase lock loop is locked. Also, where selected, the dual-selection automatic frequency control unit may utilize the coherent phase error output of the phase lock loop unit after a predetermined time period.

Although exemplary embodiments are described above, it will be obvious to those skilled in the art that many alterations and modifications may be made without departing from the invention. Accordingly, it is intended that all such alterations and modifications be included within the spirit and scope of the invention as defined in the appended claims.

We claim:

1. An apparatus for providing frequency correction utilizing dual-mode feedback for a received phase-modulated signal in a digital receiver, comprising:

A) an automatic frequency control unit, operably coupled to a first-order phase-lock loop unit and a differential phase measurement unit, for determining a frequency offset and shifting a frequency of the received signal by said frequency offset, comprising:

A1) a subtractor, for, upon receiving the signal, shifting the frequency of the receiving signal by an offset value to provide a corrected received signal wherein the subtractor is further including a symbol timing decimator operably coupled to the subtractor and a differential phase measurement unit operably coupled to the subtractor, A2) a first sign determiner, operably coupled to the differential phase measurement unit, for mapping a differential phase error to an output value in accordance with at least the sign of the differential phase error, A3) a second sign determiner, operably coupled to a phase-lock loop unit, for mapping a coherent phase error from the phase lock loop unit to an output value in accordance with at least the sign of the coherent phase error, A4) a selector, operably coupled to the first and second sign determiners, for selecting the output value of the first sign determiner during an acquisition mode and for selecting the output value of the second sign determiner during a tracking mode, A5) a filter, operably coupled to the selector, for accumulating selector output values, comparing the accumulated values to a predetermined threshold value, and generating a signal for indicating an update of a frequency step counter, A6) the frequency step counter, operably coupled to the filter, for updating a frequency offset value, A7) frequency offset value modifier, operably coupled to the frequency step counter, for providing a modified frequency offset value which is corrected for a predetermined frequency offset in the received signal, A8) an accumulator, operably coupled to the frequency offset value modifier, for accumulating the modified frequency offset value to provide a received signal frequency correction value to the subtractor, wherein the dual-mode feedback provides for differential phase error correction during acquisition and coherent phase error correction during tracking, B) a differential phase measurement unit, operably coupled to the subtractor, for utilizing the adjusted received signal to determine a differential phase error, C) a first order phase-lock loop unit, operably coupled to the symbol timing decimator, for utilizing the corrected received signal in an absence of symbol timing information to provide a coherent phase error, wherein the frequency of the received signal is shifted in frequency by the modified frequency offset value to provide an adjusted received signal for efficient frequency tracking and demodulation, and wherein the differential phase measurement unit is updated at a rate that is greater than the symbol rate.

2. The apparatus of claim 1 wherein frequency correction of the received signal is obtained utilizing dual-mode feedback.

3. The apparatus of claim 1 wherein the symbol timing decimator is utilized for decimating the received signal to provide a symbol-rate sample stream to the phase-lock loop unit.

* * * * *